United States Patent
Hong et al.

(10) Patent No.: US 7,068,561 B2
(45) Date of Patent: Jun. 27, 2006

(54) SEMICONDUCTOR MEMORY DEVICE FOR CONTROLLING CELL BLOCK WITH STATE MACHINE

(75) Inventors: Sang-Hoon Hong, Ichon-shi (KR); Jae-Bum Ko, Ichon-shi (KR); Se-Jun Kim, Ichon-shi (KR)

(73) Assignee: Hynix Semiconductor Inc., Ichon (KR)

( * ) Notice: Subject to any disclaimer, the term of this patent is extended or adjusted under 35 U.S.C. 154(b) by 25 days.

(21) Appl. No.: 11/015,475

(22) Filed: Dec. 20, 2004

(65) Prior Publication Data

US 2005/0141299 A1 Jun. 30, 2005

(30) Foreign Application Priority Data

Dec. 29, 2003 (KR) ...................... 10-2003-0098531

(51) Int. Cl.
*G11C 8/00* (2006.01)
(52) U.S. Cl. .................... 365/230.03; 365/189.09; 365/222; 711/203
(58) Field of Classification Search ........... 365/230.03, 365/189.04, 222; 711/203, 106
See application file for complete search history.

(56) References Cited

U.S. PATENT DOCUMENTS

| 6,557,080 B1 * | 4/2003 | Burger et al. ............... 711/137 |
| 6,590,824 B1 * | 7/2003 | Benedix et al. ............. 365/222 |
| 2004/0221100 A1 * | 11/2004 | Hong et al. ................. 711/106 |
| 2004/0221129 A1 * | 11/2004 | Ko et al. ..................... 711/203 |

* cited by examiner

*Primary Examiner*—Tuan T. Nguyen
*Assistant Examiner*—Toan Le
(74) *Attorney, Agent, or Firm*—Mayer, Brown, Rowe & Maw LLP

(57) ABSTRACT

A semiconductor memory device for an effective data access operation includes a cell area having N+1 number of unit cell blocks, each including M number of word lines, for storing a data in a unit cell corresponding to an inputted address; N+1 number of unit controlling blocks having respective state machines and corresponding to the respective N+1 unit cell blocks for controlling a data restoration that is accessed from a first unit cell block selected from the N+1 unit cell blocks into the first unit cell block or a second unit cell block; and a driving controlling block for controlling the N+1 unit cell blocks so that the N+1 unit controlling means are in one of first to fourth operation states.

6 Claims, 5 Drawing Sheets

SEMICONDUCTOR MEMORY DEVICE FOR CONTROLLING CELL BLOCK WITH STATE MACHINE

FIELD OF INVENTION

The present invention relates to a semiconductor memory device; and, more particularly, to a semiconductor memory device for controlling a cell block with a state machine.

DESCRIPTION OF PRIOR ART

Recently, operational speed of a CPU has been improved even beyond operational speed of a memory device such as DRAM. Such slower operational speed of the memory device than the CPU leads some problems. In order to resolve those problems, various structures of the memory device are developed to input/output data at a higher speed.

FIG. 1 is a block diagram showing a conventional semiconductor memory device disclosed in a commonly owned copending application, U.S. Ser. No. 10/696,144, filed on Oct. 28, 2003, entitled "SEMICONDUCTOR MEMORY DEVICE WITH REDUCED DATA ACCESS TIME", which is incorporated herein by reference.

Referring to FIG. 1, the memory device having high-speed data access capabilities includes a cell block 500 that is formed with 9 unit cell blocks, each unit cell block having 256 word-lines, the 9 unit cell blocks including 8 unit cell blocks corresponding to an inputted row address and an additional unit cell block, a reserved cell block table 410 for storing information about which word-line is at least to be a reserved word-line among the (8+1)×256 word-lines in the cell block 500, a tag block 430 for detecting a logical cell block address for selecting the 8 unit cell blocks by using the row address and converting the logical cell block address to a physical cell block address for selecting one of the 9 unit cell blocks, and a controlling unit 420 for controlling the tag block 430 and the reserved cell block table 410 to activate the word-line in the unit cell block that is selected by the physical cell block address, and the reserved word-line for the selected word-line, which is determined with information that is provided from the reserved cell block table 410.

Here, the controlling unit 420 controls such that restore operation for the first data is performed through the reserved word-line that is determined corresponding to the word-line that is activated to access the first data when the first data and the second data are consecutively accessed to the unit cell block that is selected among the 9 unit cell blocks.

FIG. 2 shows an operational flow of a memory device shown in FIG. 1.

Referring to FIG. 2, the memory device in FIG. 1 performs the restore operation for the previous data in the unit cell block corresponding to the predetermined reserved word-line when data are consecutively accessed to one cell block while it performs in interleaving mode when data are alternately accessed to the unit cell blocks. Accordingly, the memory device can access data at a higher speed without regard to access pattern. For reference, detailed description is provided in the specification of the U.S. patent application, U.S. Ser. No. 10/696,144, filed on Oct. 28, 2003, entitled "SEMICONDUCTOR MEMORY DEVICE WITH REDUCED DATA ACCESS TIME", which is incorporated herein by reference.

As seen in FIG. 2, the memory device includes the reserved cell block 410 and the tag block 430 so as to reduce data access time by an amount to be consumed for data restore operation.

However, since data restore operation is performed in other unit cell block having the reserved word-line than the initially accessed unit cell block, the unit cell blocks should be respectively controlled in the data access.

For example, it is controlled to perform data sense amplifying operation in the first unit cell block while it is controlled to perform data restore operation in the second unit cell block.

Accordingly, as seen in FIG. 1, if operation of the entire unit cell blocks is to be controlled with one controlling unit, circuit configuration of the controlling unit becomes so complicated, which will lead an obstacle to the high speed operation.

SUMMARY OF INVENTION

It is, therefore, an object of the present invention to provide a semiconductor memory device having a state machine to facilitate driving control.

In accordance with an aspect of the present invention, there is provided a semiconductor memory device for an effective data access operation including: a cell area having N+1 number of unit cell blocks, each including M number of word lines, for storing a data in a unit cell corresponding to an inputted address; N+1 number of unit controlling blocks having respective state machines and corresponding to the respective N+1 unit cell blocks for controlling a data restoration that is accessed from a first unit cell block selected from the N+1 unit cell blocks into the first unit cell block or a second unit cell block; and a driving controlling block for controlling the N+1 unit cell blocks so that the N+1 unit controlling means are in one of first to fourth operation states.

In accordance with another aspect of the present invention, there is provided a memory device including a cell block including N+1 unit cell blocks, each unit cell block having M word-lines, the N+1 unit cell blocks including the N unit cell blocks corresponding to an inputted row address and an additional unit cell block; and a controlling unit including N+1 unit controlling units and a driving controlling unit, the N+1 unit controlling units having respective state machines and corresponding to the respective N+1 unit cell blocks, in order to control to restore data that is accessed from a first unit cell block selected from the N+1 unit cell blocks into the first unit cell block or a second unit cell block.

The unit controlling unit controls the corresponding unit cell block depending on a first operation state for accessing data to the unit cell block, a second operation state for performing the restore operation for the first data into the unit cell block that is not accessed when the first and the second data are consecutively accessed to one unit cell block, a third operation state for performing the restore operation for the first data into the unit cell block when the first and second data are not consecutively accessed to the unit cell block, and a fourth state for performing an operation corresponding a waiting mode.

The driving controlling unit controls the N+1 unit cell blocks so that the N+1 unit controlling units are in one of the first to fourth operation states.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
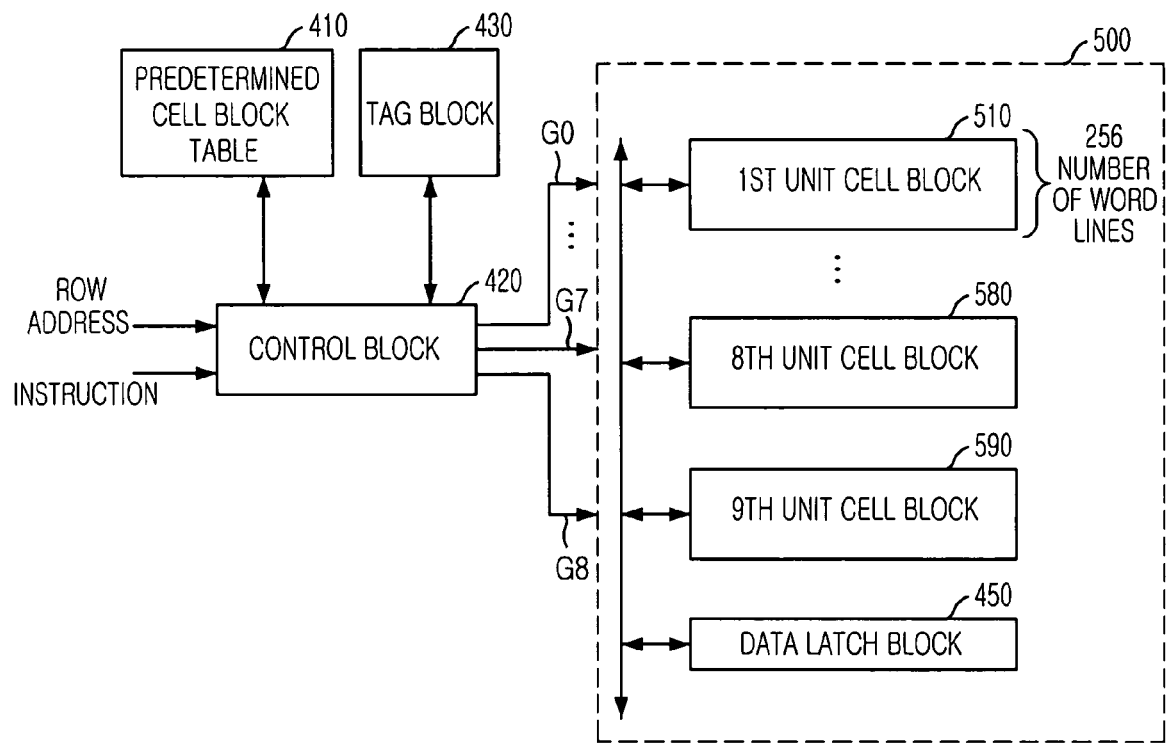
FIG. 1 is a block diagram showing a conventional semiconductor memory device having a tag block.
Figure 2:
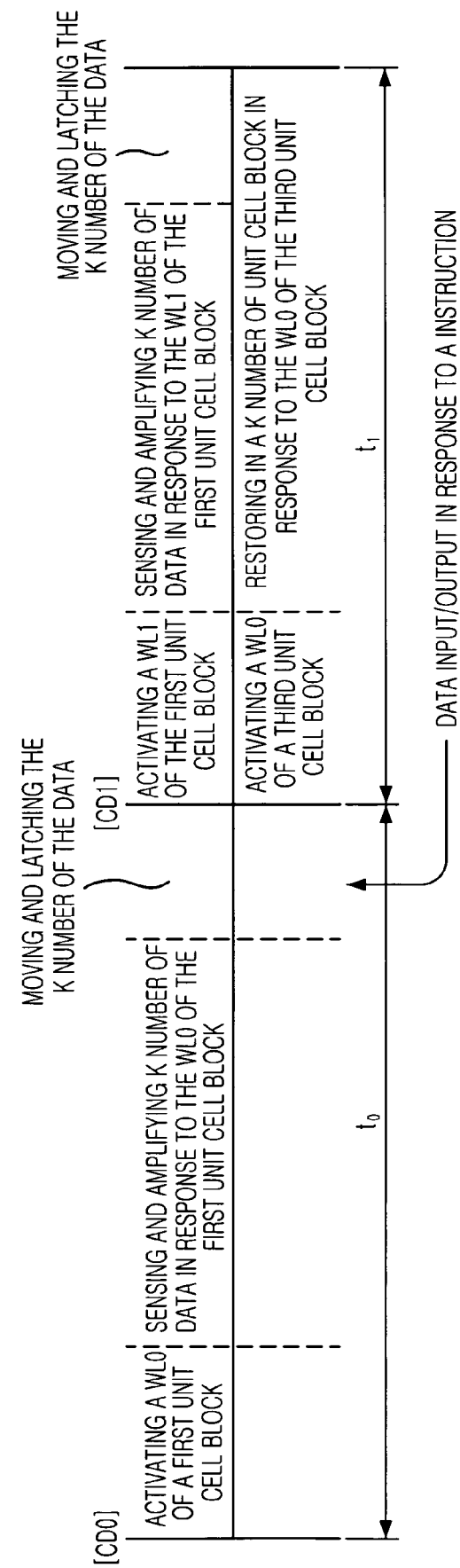
FIG. 2 is a waveform diagram showing operation of a semiconductor memory device shown in FIG. 1.
Figure 3:
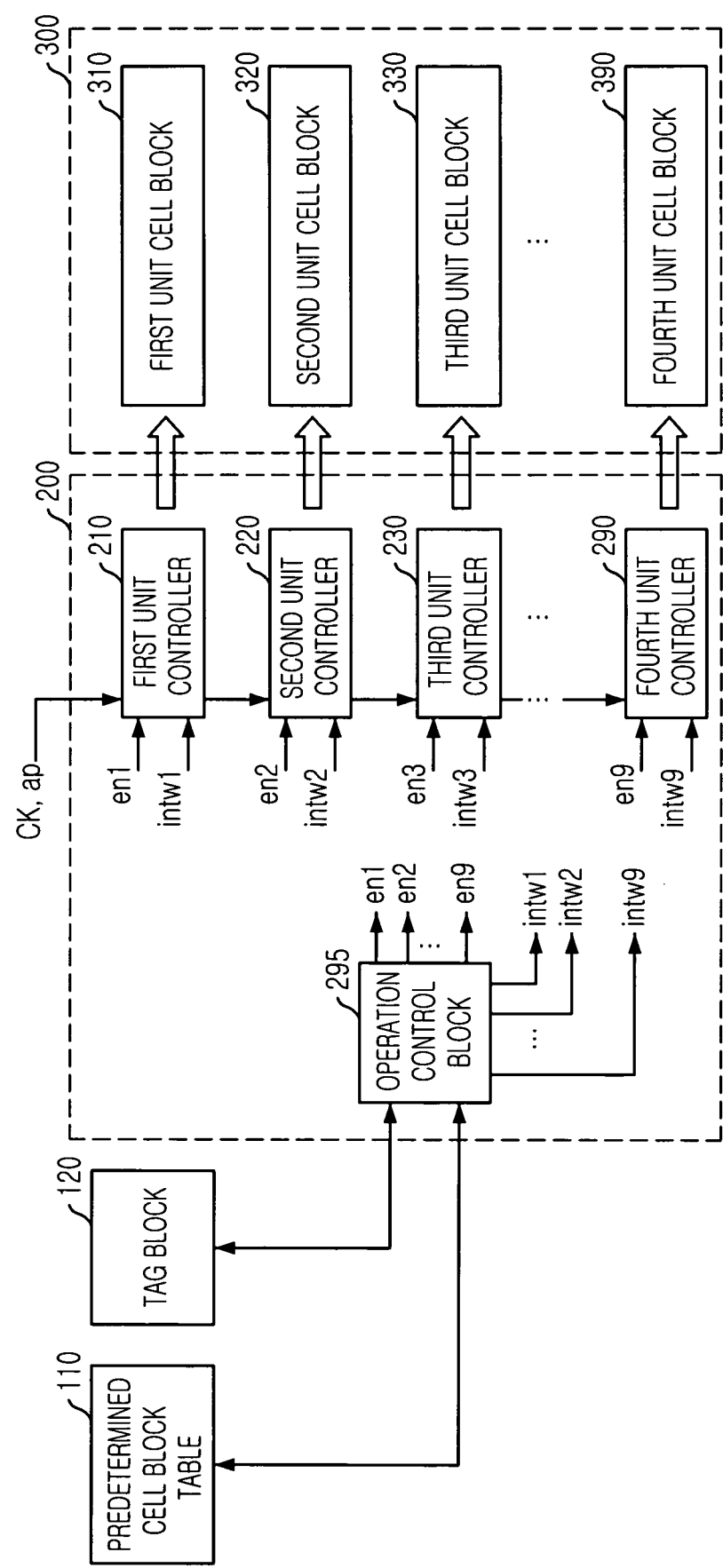
FIG. 3 is a block diagram showing a semiconductor memory device in accordance with a preferred embodiment of the present invention.

FIG. 3 is a block diagram showing a semiconductor memory device in accordance with a preferred embodiment of the present invention.

Referring to FIG. 3, the memory device of the present invention includes a cell block 300 including 8+1 unit cell blocks, each having 256 word-lines, the 9 unit cell blocks including the 8 unit cell blocks corresponding to an inputted row address and an additional unit cell block, and a controlling unit 200 including 8+1 unit controlling units 210–290 and a driving controlling unit 295, the 8+1 unit controlling unit having respective state machines and corresponding to respective 8+1 unit cell blocks, for controlling to restore data that is accessed from a first unit cell block selected from the 8+1 unit cell blocks into the first unit cell block or a second unit cell block different from the first unit cell block.

The driving controlling unit 295 outputs a first control signal (one of signals en1–en9) and a second control signal (one of signals intw1–intw9) to the 8+1 unit controlling units 210–290, respectively, so that each unit cell block can be operated in one state selected from a first to fourth operational states S1–S4, which will be described in detail.

Here, a tag block 120 and a reserved cell block table 110 operate as similar to those disclosed in a Korea Patent application no. 2003-11121 filed by the inventor of the present invention.

Figure 4:
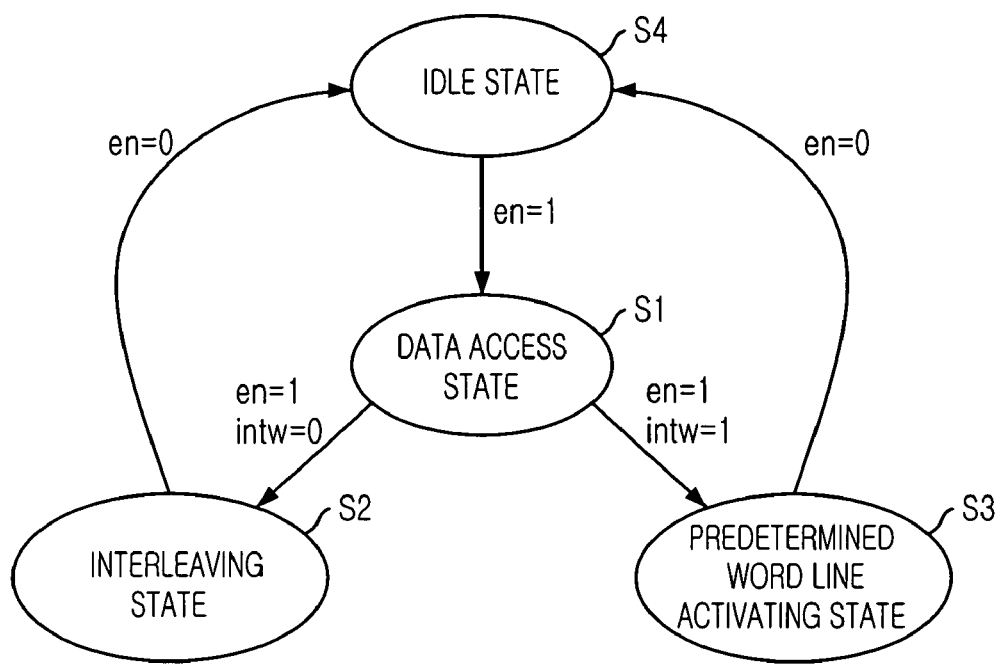
FIG. 4 is a state table showing operation state of a state machine in a unit controlling unit shown in FIG. 3.

FIG. 4 is a state table showing operation state of a state machine that is included in a unit controlling unit shown in FIG. 3.

Referring to FIGS. 3 and 4, the driving controlling unit 295 controls the 8+1 unit cell blocks so that the 8+1 unit controlling units 210–290 are in one of the first to fourth operational states S1–S3.

The unit controlling unit 210 controls the corresponding unit cell block 310 depending on the first operational state S1, a data access state, for accessing data to the unit cell block, the second operational state S2, an interleave state, for performing the restore operation for the first data into the unit cell block that is not accessed when the first and second data are consecutively accessed to one unit cell block, the third operational state S3, a reserved word-line driving state, for performing the restore operation for the first data into the unit cell block when the first and second data are not consecutively accessed to the unit cell block, and the fourth operational state S4, a waiting state, for performing an operation corresponding to a waiting mode.

Figure 5:
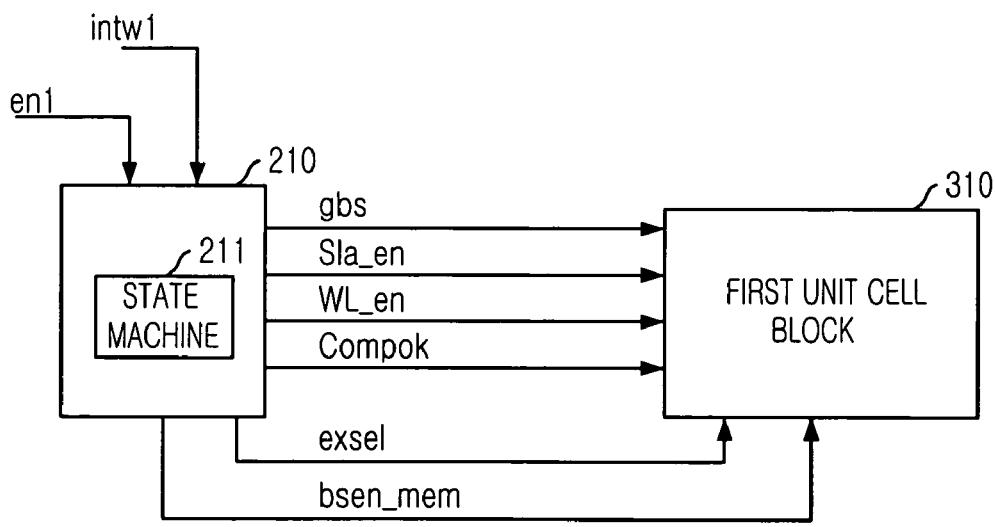
FIG. 5 is a block diagram showing various control signals with which a unit controlling unit shown in FIG. 3 controls a unit cell block.

FIG. 5 is a block diagram showing various control signals with which a unit controlling unit shown in FIG. 3 controls a unit cell block.

Referring to FIG. 5, the unit controlling unit 210 includes a state machine 211 to control, in response to the first control signal en1, the corresponding unit cell block 310 to operate in the first operational state S1, the data access state, and control, in response to activation of the second control signal intw1 while the first control signal en1 is inputted in activated state, the corresponding unit cell block 310 to operate in the second operational state S2 or the third operational state S3.

For this, the unit controlling unit 210 generates various control signals gbis, S/A_en, WL_en, compok, exsel, bis, esen_mem and outputs those signals to the corresponding unit cell block 310.

Here, the control signal gbis is a signal for activating a global bit-line switch that is included in the unit cell block. The control signal S/A_en is a signal for enabling a bit-line sense amplifier included in the unit cell block. The control signal WL_en is a signal for activating the word-line. The control signal compok is a signal for accessing data for the corresponding unit cell block. The control signal exsel is a signal for restoring the unit cell data corresponding to the reserved word-line that is included in the corresponding unit cell block. The control signal bis is a signal for activating a local bit-line switch. The control signal bsen_mem is a signal for pre-charging the bit-line sense amplifier.

The above control signals are given for an example of the unit controlling unit to control the operational state of the unit cell block in one of the first to fourth operational states S1–S3. Actually, more signals are used and another control signal can be used depending on the form of the unit cell block.

Hereinafter, it will be described for operation of the memory device according to the present embodiment with reference to FIGS. 3 to 5.

The memory device according to the present embodiment operates as similar to data access operation of the memory device as disclosed in the Korea Patent application no. 2003-11121 filed by the inventor of the present invention. That is, when data are consecutively accessed to one unit cell block, restore operation for the previous data is performed in the unit cell block corresponding to the predetermined reserved word-line. When the data are accessed to the unit cell blocks alternately, restore operation is performed in the interleaving mode. Therefore, data access can be performed in a high speed regardless of the accessed data pattern.

As described above, in order to operate the memory, when the first data and the second data are consecutively accessed to one unit cell block, the currently accessed unit cell block processes access operation for the second data and the other unit cell block, i.e., the unit cell block having the reserved word-line corresponding to the word-line that is activated by the first data, performs the restore operation for the first data.

Further, when the first data and the second data do not access the same unit cell block, the restore operation for the first data should be performed in the same unit cell block and data access for the second data should be performed in the other unit cell block during the restore operation for the first data. That is, each unit cell block is controlled to operate in different states from each other during data access.

In order to control it more simply and more efficiently, the memory device of the present embodiment includes the unit controlling unit corresponding to each unit cell block, which has a state machine.

Each unit controlling unit controls the corresponding unit cell block to be in one of the first to fourth states, which will be controlled with the state machine.

In the first operational state S1, the first data is accessed to the selected unit cell block. In this state, one word-line is activated in the selected unit cell bock and a number of data corresponding to the activated word-line are sense-amplified.

When the executed command is read operation, any data among a number of the sense-amplified data is outputted outside. When the executed command is write operation, any data among a number of the sense-amplified data is replaced with an external data.

Subsequently, in the second state S2, the second data next to the first data is accessed to the other unit cell block than the unit cell block to which the first data is accessed. In this state, the restore operation for the first data is performed in the originally accessed unit cell block.

In the operational second state S2, the second data is accessed at the timing of the restore operation of the first data, in the interleaving mode.

Subsequently, in the operational third state S3, when the second data is accessed to the same unit cell block to which the first data has been accessed, the restore operation for the first data is performed.

In this state, the restore operation for the first data is performed in the unit cell block that includes the reserved word-line corresponding to the word-line that is activated by the first data. At this point, the corresponding unit controlling unit controls the unit cell block including the reserved word-line to be in the third state. For reference, the reserved word-line is continuously changed during memory device operation, which is provided in the Korea Patent application no. 2003-11121 filed by the inventor of the present invention.

In the third operational state S3, when the first and the second data are consecutively accessed to one unit cell block, the restore operation for the first data is performed in the unit cell block including the reserved word-line rather than the original unit cell block. At this point, the restore operation for the first data is performed in the unit cell block including the reserved word-line.

Subsequently, in the fourth operational state S4, when no data access occurs, it goes to the waiting mode. The unit controlling units 210–290 controls the respective unit cell blocks to be in one among the first to fourth operational states by using the state machines that is included within each of the unit controlling units 210–290.

On the other hand, each of the unit controlling units 210–290 receives corresponding ones of the first and second control signals en1–en9, intw1–intw9 to determine the operational state to be controlled.

First, when the first control signal en1 is inputted in activated, the unit controlling unit 210 controls the corresponding unit cell bock to be in the first operational state S1.

Subsequently, while the first control signal en1 is activated, the unit controlling unit 210 controls the corresponding unit cell block to be in the second operational state S2 when the second control signal intw1 is inputted in deactivated to a low level. On the contrary, while the first control signal en1 is activated, the unit controlling unit 210 controls the corresponding unit cell block to be in the third operational state S3 when the second control signal intw1 is inputted in activated to a high level.

As described above, the memory device of the present embodiment includes the unit controlling units for respective unit cell blocks and each of the unit controlling units controls the corresponding unit cell block depending on the state that is determined with the state machine. Accordingly, the driving controlling unit only outputs signals for the operational states of the respective unit controlling units so that the various control operations can be significantly simplified.

Consequently, each of the unit controlling unit outputs the control signal with using the state machine continuously and the driving controlling unit outputs the simple signals based on the operational states so that operational time for the control operation can be significantly reduced. By constructing the memory device as described above, circuit area for the memory control circuit can be reduced compared to using one control circuit to control all the unit cell blocks.

Though the present invention is described for the case disclosed in the Korea Patent application no. 2003-11121 filed by the inventor of the present invention, it can be possible to improve the memory device capable of reducing circuit area and control time of the control unit with applying the present invention to various memory devices that differently control the unit cell blocks.

Figure 6:
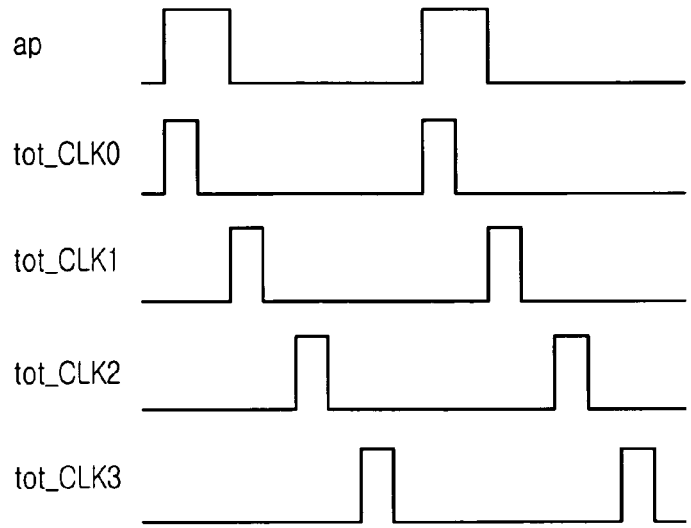
FIG. 6 is a waveform diagram showing internal operation of a unit controlling unit shown in FIG. 3.
Figure 7:
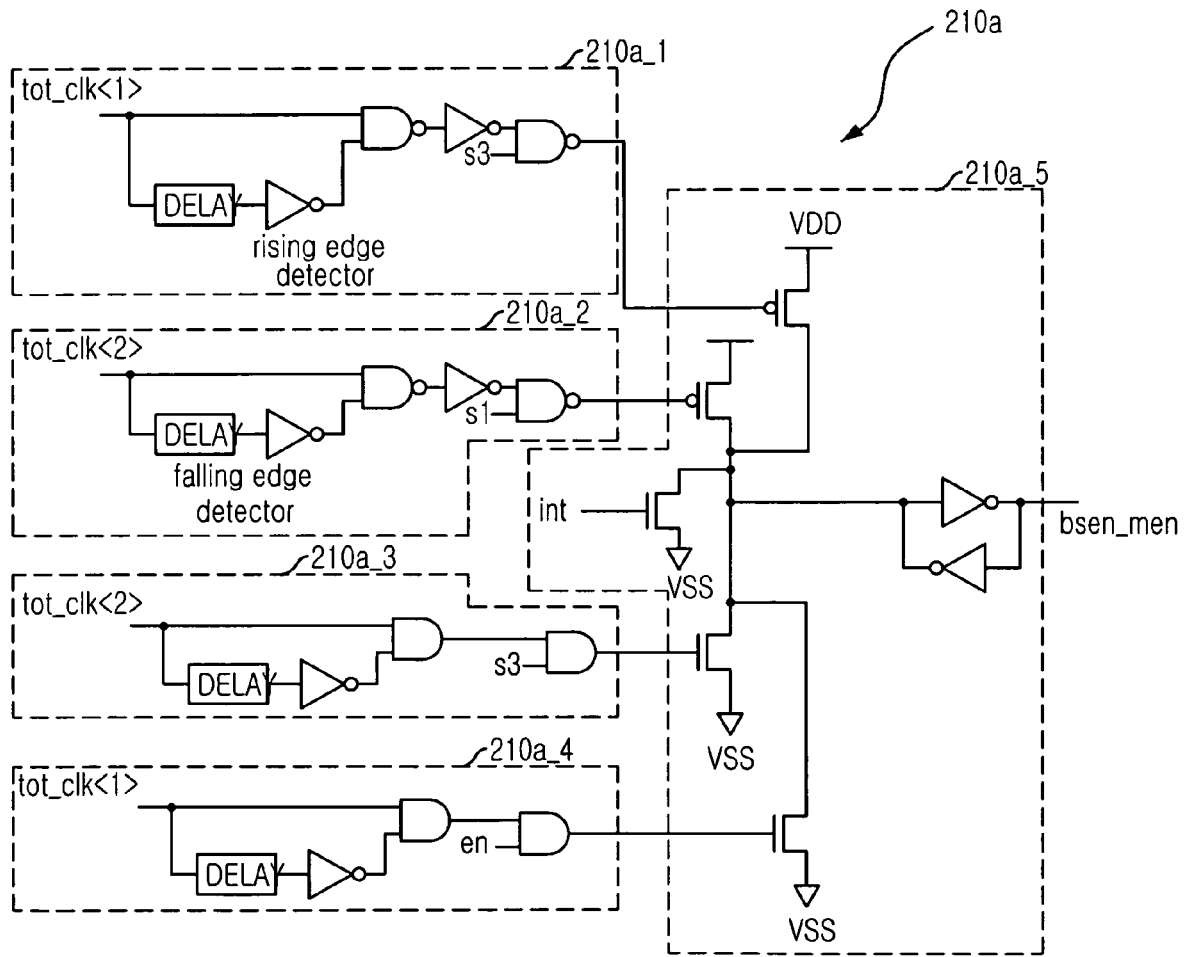
FIG. 7 is a circuit diagram for generating a pre-charge control signal that is outputted from a unit controlling unit shown in FIG. 3.

On the other hand, the unit controlling unit generates a number of internal signals to control the corresponding unit cell block. FIG. 6 shows the basic waveforms for generating the control signals and FIG. 7 shows an example of the circuit for generating the control signal bsen_mem with using the waveforms shown in FIG. 6.

In FIG. 6, four reference pulses tot_CLK0–tot_CLK3 that are generated at the timings different from each other with using a reference signal ap are shown. In the reference signal ap, two pulses are generated, the first one being the pulse tot_CLK0–tot_CLK3 generated at the operational timing of the tag block and the second one being the pulse generated when the unit cell block is selected by converting the inputted address.

By using the two pulses that are generated in response to the reference signal ap, four different reference pulses are generated with reference to each timing. The unit controlling unit generates required internal control signals by using the reference pulses and outputs the control signals to the corresponding unit cell block.

According to the present invention, in the memory device that requires the respective unit cell block to be controlled depending on their respective operational states, the circuit area of the controlling unit can be significantly reduced. Further, control time for the cell blocks that are controlled in different operational states can be significantly reduced.

The present application contains subject matter related to Korean patent application No. 2003-98531, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for an effective data access operation, comprising:

a cell array having N+1 number of unit cell blocks, each including M number of word lines, for storing a data in a unit cell corresponding to an inputted address;

N+1 number of unit controlling means having respective state machines and corresponding to the respective N+1 unit cell blocks for controlling a data restoring operation that is accessed from a first unit cell block selected from the N+1 unit cell blocks into the first unit cell block or a second unit cell block; and a driving controlling means for controlling the N+1 unit cell blocks so that the N+1 unit controlling means are in one of first to fourth operation states.

2. The semiconductor memory device as recited in claim 1, wherein the inputted address is corresponding to N number of unit cell blocks.

3. The semiconductor memory device as recited in claim 2, further comprising:

a predetermined cell block table for storing information wherein at least more than one word line among the (N+1)×M number of the word lines is assigned as a predetermined restorable word line by using the information; and a tag block for sensing the inputted address designated for the N number of unit cell blocks and converting the inputted address into a physical cell block address designated for the N+1 number of unit cell blocks.

4. The semiconductor memory device as recited in claim 1, wherein the unit controlling means controls the corresponding unit cell block depending on a first operation state for accessing data to the unit cell block, a second operation state for performing the restore operation for the first data into the unit cell block that is not accessed when the first and the second data are consecutively accessed to one unit cell block, a third operation state for performing the restore operation for the first data into the unit cell block when the first and second data are not consecutively accessed to the unit cell block, and a fourth state for performing an operation corresponding a waiting mode.

5. The memory device as recited in claim 4, wherein the driving controlling means outputs a first control signal and a second control signal to the respective N+1 unit controlling means so that the respective unit cell blocks can operate in one of the first to fourth operation states.

6. The memory device as recited in claim 5, wherein unit controlling means controls the corresponding unit cell block to be in the first operations state in response to the activated first control signal, and controls the corresponding unit cell block to be in the second operation state or the third operation state depending on activation of the second control signal while the first control signal is inputted as activated.

* * * * *